US010648074B2

(12) United States Patent
Hoffman et al.

(10) Patent No.: US 10,648,074 B2
(45) Date of Patent: *May 12, 2020

(54) PHYSICAL VAPOR DEPOSITION WITH ISOTROPIC NEUTRAL AND NON-ISOTROPIC ION VELOCITY DISTRIBUTION AT THE WAFER SURFACE

(71) Applicant: Applied Materials, Inc., Santa Clara, CA (US)

(72) Inventors: Daniel J. Hoffman, Saratoga, CA (US); Karl M. Brown, Los Gatos, CA (US); Ying Rui, Sunnyvale, CA (US); John Pipitone, Livermore, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/516,111

(22) Filed: Jul. 18, 2019

(65) Prior Publication Data

US 2019/0338411 A1  Nov. 7, 2019

Related U.S. Application Data

(63) Continuation of application No. 15/853,566, filed on Dec. 22, 2017, now Pat. No. 10,400,328, which is a
(Continued)

(51) Int. Cl.
*C23C 14/34* (2006.01)
*C23C 14/35* (2006.01)
(Continued)

(52) U.S. Cl.
CPC .......... *C23C 14/35* (2013.01); *C23C 14/3471* (2013.01); *C23C 14/50* (2013.01);
(Continued)

(58) Field of Classification Search
CPC .... C23C 14/3471; C23C 14/34; C23C 14/542
See application file for complete search history.

(56) References Cited

U.S. PATENT DOCUMENTS

| 5,439,574 A | 8/1995 | Kobayashi et al. |
| 5,855,716 A | 1/1999 | Tonucci et al. |
| (Continued) | | |

FOREIGN PATENT DOCUMENTS

| CN | 1950922 | 4/2007 |
| JP | H05-125537 | 5/1993 |
| (Continued) | | |

OTHER PUBLICATIONS

PCT International Search Report and Written Opinion in International Appln. No. PCT/US2009/001611, dated Oct. 29, 2009, 6 pages.
(Continued)

*Primary Examiner* — Jason Berman
(74) *Attorney, Agent, or Firm* — Fish & Richardson P.C.

(57) ABSTRACT

In a plasma enhanced physical vapor deposition of a material onto workpiece, a metal target faces the workpiece across a target-to-workpiece gap less than a diameter of the workpiece. A carrier gas is introduced into the chamber and gas pressure in the chamber is maintained above a threshold pressure at which mean free path is less than 5% of the gap. RF plasma source power from a VHF generator is applied to the target to generate a capacitively coupled plasma at the target, the VHF generator having a frequency exceeding 30 MHz. The plasma is extended across the gap to the workpiece by providing through the workpiece a first VHF ground return path at the frequency of the VHF generator.

18 Claims, 5 Drawing Sheets

Related U.S. Application Data continuation of application No. 12/077,067, filed on Mar. 14, 2008, now Pat. No. 9,856,558.

(51) Int. Cl.
    H01J 37/32      (2006.01)
    H01J 37/34      (2006.01)
    C23C 14/50      (2006.01)
    C23C 14/54      (2006.01)

(52) U.S. Cl.
    CPC ........ C23C 14/542 (2013.01); H01J 37/3266 (2013.01); H01J 37/32091 (2013.01); H01J 37/32174 (2013.01); H01J 37/32577 (2013.01); H01J 37/32706 (2013.01); H01J 37/32715 (2013.01); H01J 37/34 (2013.01); H01J 37/3444 (2013.01)

(56) References Cited

U.S. PATENT DOCUMENTS

| | | |
|---|---|---|
| 6,287,986 B1 | 9/2001 | Mihara |
| 7,214,619 B2 | 5/2007 | Brown et al. |
| 7,244,344 B2 | 7/2007 | Brown et al. |
| 7,268,076 B2 | 9/2007 | Brown et al. |
| 9,856,558 B2 * | 1/2018 | Hoffman ............ C23C 14/35 |
| 2006/0073283 A1 | 4/2006 | Brown et al. |
| 2006/0169578 A1 | 8/2006 | Brown et al. |
| 2006/0169582 A1 | 8/2006 | Brown et al. |
| 2006/0169584 A1 | 8/2006 | Brown et al. |
| 2006/0172517 A1 | 8/2006 | Brown et al. |
| 2006/0172536 A1 | 8/2006 | Brown et al. |
| 2006/0191876 A1 | 8/2006 | Brown et al. |
| 2007/0193982 A1 | 8/2007 | Brown et al. |
| 2008/0014747 A1 | 1/2008 | Brown et al. |
| 2018/0119272 A1 | 5/2018 | Hoffman et al. |

FOREIGN PATENT DOCUMENTS

| | | |
|---|---|---|
| JP | H06-179968 | 6/1994 |
| JP | H06-192824 | 7/1994 |
| JP | H10-055983 | 2/1998 |
| JP | 10-265952 | 6/1998 |
| JP | H10-265952 | 10/1998 |
| JP | H11-001770 | 1/1999 |
| JP | 2001-007204 | 1/2001 |
| JP | 2002-176037 | 6/2002 |
| KR | 20000005601 | 1/2000 |
| TW | 357397 | 5/1999 |

OTHER PUBLICATIONS

JP Office Action in Japanese Application No. 2010-550698, dated Jun. 11, 2013, 4 pages.

CN Office Action in Chinese Appln. No. 200980107144.4, dated Mar. 7, 2012.

Rossnagel, "Directional and ionized physical vapor deposition for microelectronics," Journal Vaccuum Science Technology, Sep./Oct. 1998, vol. 16, No. 5, USA.

\* cited by examiner

PHYSICAL VAPOR DEPOSITION WITH ISOTROPIC NEUTRAL AND NON-ISOTROPIC ION VELOCITY DISTRIBUTION AT THE WAFER SURFACE

CROSS-REFERENCE TO RELATED APPLICATIONS

This application is a continuation of U.S. application Ser. No. 15/853,566, filed Dec. 22, 2017, which is a continuation of U.S. application Ser. No. 12/077,067, filed on Mar. 14, 2008, the entire disclosures of which are incorporated by reference.

BACKGROUND

Plasma enhanced physical vapor deposition (PECVD) processes are used to deposit metal films such as copper onto semiconductor wafers to form electrical interconnections. A high level of D.C. power is applied to a copper target overlying the wafer in the presence of a carrier gas, such as argon. Plasma source power may be applied via a coil antenna surrounding the chamber. PECVD processes typically rely upon a very narrow angular distribution of ion velocity to deposit metal onto sidewalls and floors of high aspect ratio openings. One problem is how to deposit sufficient material on the sidewalls relative to the amount deposited on the floors. Another problem is avoiding pinch-off of the opening due to faster deposition near the top edge of the opening. As miniaturization of feature sizes has progressed, the aspect ratio (depth/width) of a typical opening has increased, with microelectronic feature sizes having now been reduced to about 22 nanometers. With greater miniaturization, it has become more difficult to achieve minimum deposition thickness on the sidewall for a given deposition thickness on the floor or bottom of each opening. The increased aspect ratio of the typical opening has been addressed by further narrowing of the ion velocity angular distribution, through ever-increasing wafer-to-sputter target distance and ever lower chamber pressures, e.g., less than 1 mT (to avoid velocity profile widening by collisions). This has given rise to a problem observed in thin film features near the edge of the wafer: At extremely small feature sizes, a portion of each high aspect ratio opening sidewall is shadowed from a major portion of the target because of the greater wafer-to-target gap required to meet the decreasing feature size. This shadowing effect, most pronounced near the wafer edge, makes it difficult if not impossible to reach a minimum deposition thickness on the shadowed portion of the side wall. With further miniaturization, it has seemed a further decrease and chamber pressure (e.g., below 1 mT) and a further increase in wafer-sputter target gap would be required, which would exacerbate the foregoing problems.

One technique employed to supplement the side wall deposition thickness is to deposit an excess amount of the metal (e.g., Cu) on the floor of each opening and then re-sputter a portion of this excess on the opening side wall. This technique has not completely solved the shadowing problem and moreover represents an extra step in the process and a limitation on productivity.

A related problem is that the sputter target (e.g., copper) must be driven at a high level of D.C. power (e.g., in the range of kW) to ensure an adequate flow of ions to the wafer. Such a high level of D.C. power rapidly consumes the target (driving up costs) and produces an extremely high deposition rate so that the entire process is completed in less than five seconds. This time is about 40% of the time required for the RF source power impedance match to equilibrate following plasma ignition, so that about 40% of the process is performed prior to stabilization of the impedance match and delivered power.

SUMMARY

A method is provided for performing physical vapor deposition on a workpiece in a reactor chamber. The method includes providing a target comprising a metallic element and having a surface facing the workpiece, and establishing a target-to-workpiece gap less than a diameter of the workpiece. A carrier gas is introduced into the chamber and gas pressure in the chamber is maintained above a threshold pressure at which mean free path is less than 5% of the gap. RF plasma source power from a VHF generator is applied to the target to generate a capacitively coupled plasma at the target, the VHF generator having a frequency exceeding 30 MHz. The method further includes extending the plasma across the gap to the workpiece by providing through the workpiece a first VHF ground return path at the frequency of the VHF generator.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
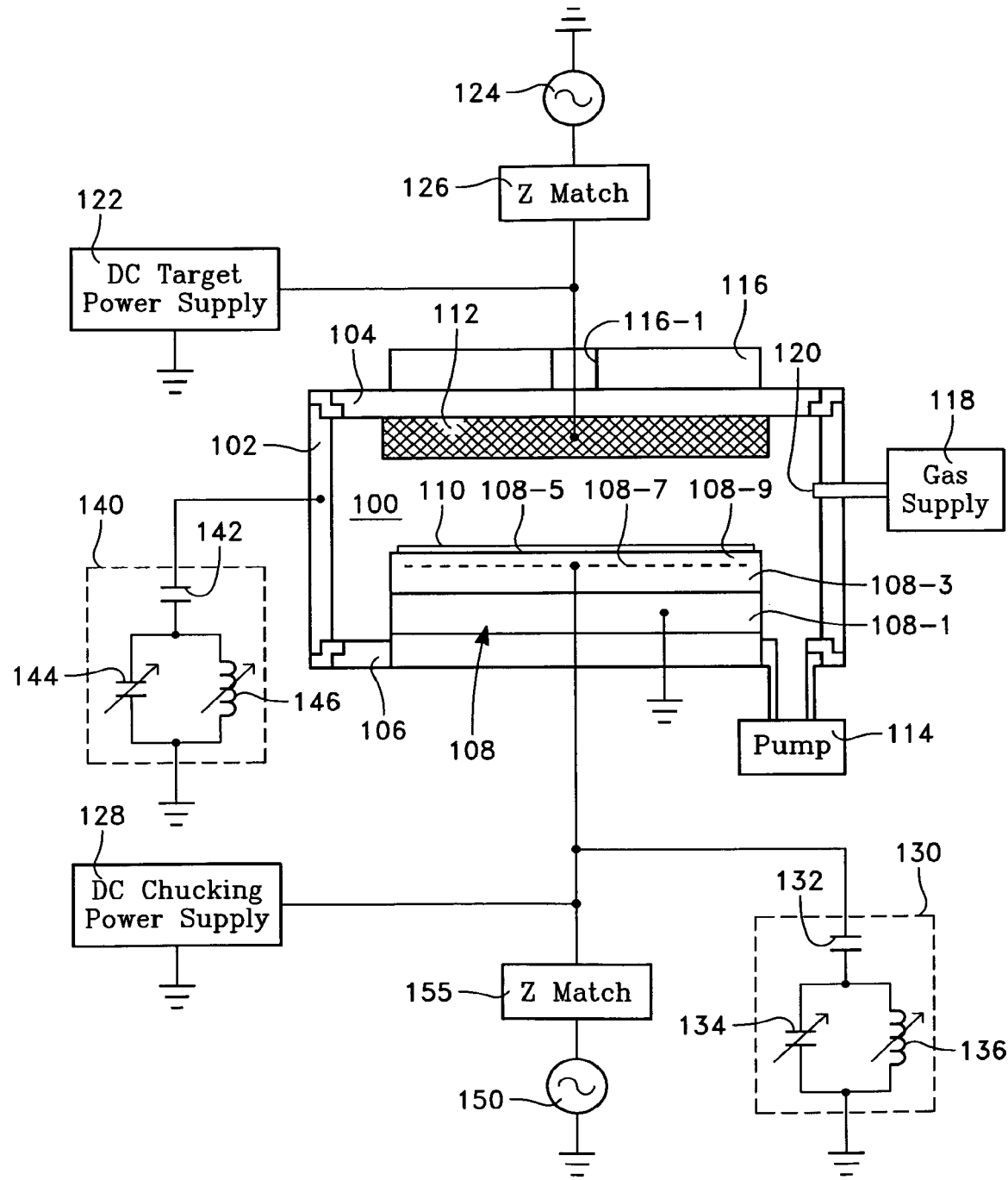
FIG. 1 is a diagram of a plasma reactor in accordance with a first aspect.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

In one embodiment, a PEPVD process provides complete uniform sidewall coverage at feature sizes of 25 nm and below (e.g., 18 nm) free of the non-uniformities caused by shadowing. The PEPVD process of this embodiment is carried out with VHF plasma source power on the sputter target to create a capacitively coupled RF plasma at the target. The process further employs a very low (or no) D.C.

power on the sputter target. With the low D.C. power level on the target, the process may be performed over a period of time that is longer than the settling time of the impedance match elements, and sufficiently long for good process control and chamber matching. These advantages are realized by using high chamber pressure to at least reduce or totally eradicate the neutral directionality from the metal target to the wafer. If, in fact the remaining deposition were to be accomplished from neutrals emanating from the vacuum gap of the mean free path above the wafer, the features would totally be pinched off. However, the RF power maintains a significant density of metal ions in the plasma, making them available for attraction to the wafer by electric field. The electric field can be derived by either a residual RF field from the VHF plasma source at the ceiling (target) or by a small RF bias power applied to the wafer directly. This then creates a predominantly vertical ion velocity distribution with some perpendicular (horizontal) velocity component for side wall coverage. The result is that the side wall and floor of each high aspect ratio opening is conformally covered with the sputtered material from the target. In summary, the source provides a nearly isotropic distribution of neutral velocity and a distribution of ion velocity including a large vertical component and a relatively smaller non-vertical or horizontal component. The isotropic neutral velocity distribution and somewhat broadened but predominantly vertical ion velocity distribution at the wafer surface is realized by maintaining the chamber at an extremely high pressure (e.g., 100 mT) to ensure an ion collision mean free path that is $\frac{1}{20}^{th}$ of the wafer-to-sputter target gap. A high flux of sputtered ions at the wafer is realized by: (1) minimizing the wafer-to-sputter target gap to a fraction of the wafer diameter, (2) generating a VHF capacitively coupled plasma at the sputter target (as mentioned above) and (3) extending the capacitively coupled plasma down to the wafer. The plasma is extended down to the wafer by providing an attractive VHF ground return path through the wafer. The process window is expanded by reducing (or possibly eliminating) the D.C. power applied to the sputter target, so that the target consumption rate is reduced and the process is less abrupt. This reduction in D.C. target power without loss of requisite sputtering is made possible by the high density plasma generated at the target by application of VHF power to the target and by the reduced wafer-to-sputter target gap.

Undesirable ion bombardment by ions of the carrier gas (e.g., argon ions) is suppressed by selectively favoring the desired sputter target ions (e.g., copper ions) at the plasma sheath overlying the wafer surface. This selection is made by maintaining the wafer bias voltage below an upper threshold voltage (e.g., 300 volts) above which carrier gas (e.g., argon) ions interact with or damage thin film structures on the wafer. However, the wafer bias voltage is maintained above a lower threshold voltage (e.g., 10-50 volts) above which the sputter target material (e.g., copper) ions deposit on the wafer surface. Such a low wafer bias voltage is achieved by differential control of VHF ground return path impedances for the VHF source power through: (a) the wafer and (b) the chamber side wall, respectively. Decreasing the VHF ground return path impedance through the sidewall tends to decrease the wafer bias voltage. This control is provided by independent variable impedance elements governing ground return path impedances through the side wall and through the wafer, respectively.

The wafer bias voltage is also minimized as follows: The VHF source power applied to the target creates a modest positive bias voltage on the wafer, in the absence of any other applied RF power. This positive wafer bias may be offset by applying a small amount of optional low frequency (LF) RF bias power to the wafer. The LF bias power tends to contribute a negative bias voltage on the wafer, so that its negative contribution may be adjusted or balanced against the positive contribution of the VHF source power to produce a net wafer bias voltage that is close to zero, if desired, or as small as desired. Specifically, the wafer bias voltage is reduced well below the carrier gas ion bombardment bias threshold referred to above.

The foregoing process has been discussed above with reference to a PEPVD process for depositing copper. However, the process can be used to deposit a wide range of materials other than copper. For example, the sputter target may be titanium, tungsten, tin (or other suitable metallic materials or alloys) for PEPVD deposition of the metallic target material (e.g., titanium, tungsten or tin). Moreover, a metallic (e.g., titanium) target may be employed with a nitrogen process gas for deposition of titanium nitride or other metallic nitride, where a carrier gas (argon) is used for plasma ignition and is then replaced by nitrogen for the metallic (titanium) nitride deposition.

Referring to FIG. 1, a PEPVD reactor in accordance with a first embodiment includes a vacuum chamber 100 defined by a cylindrical sidewall 102, a ceiling 104 and floor 106, the chamber containing a wafer support 108 for holding a wafer 110 in facing relationship with the ceiling 104. A metal sputtering target 112 is supported on the interior surface of the ceiling 104. A vacuum pump 114 maintains pressure within the chamber 100 at a desired sub-atmospheric value. A conventional rotating magnet assembly or "magnetron" 116 of the type well-known in the art overlies the ceiling 104 directly above the sputtering target 112. A process gas supply 118 furnishes a carrier gas such as argon into the chamber 100 through a gas injection apparatus 120, which may be a gas injection nozzle, an array of nozzles or a gas distribution ring.

The wafer support 108 may embody an electrostatic chuck including a grounded conductive base 108-1, an overlying dielectric puck 108-3 having a wafer support surface 108-5, and an electrode or conductive mesh 108-7 inside the puck 108-3 and separated from the wafer support surface by a thin layer 108-9 of the dielectric puck 108-3.

A D.C. power supply 122 is connected to the center of the target 112 through a central aperture 116-1 in the magnetron 116. An RF plasma source power generator 124 having a VHF frequency is coupled through a VHF impedance match 126 to the center of the target 112 through the center magnetron aperture 116-1. A D.C. chucking voltage supply 128 is connected to the chuck electrode 108-7.

In operation, the VHF power generator 124 provides about 4 kW of plasma source power to support a capacitively coupled plasma at the target 112 initially consisting of ions of the carrier gas. This plasma sputters the target 112 to generate free target (e.g., copper) atoms which become ionized in the plasma, the rotation of the magnetic fields of the magnetron 116 helping to distribute the consumption of the target 112 and promote ionization near the target 112. The reactor includes features that enable the plasma generated at the target 112 to reach the wafer 110. In accordance with one such feature, the plasma formed at the target 112 by the capacitively coupled VHF power from the generator 124 is made to extend down to the wafer 110 by providing an attractive VHF ground return path through the wafer 110 (i.e., through the wafer support 108). For this purpose, a variable impedance element 130 is coupled between the electrode 108-7 and ground. Other than this connection, the electrode 108-7 is insulated from ground, so that the impedance element 130 provides the only connection between the electrode 108-7 and ground. The variable impedance element 130 in one implementation consists of a series reactance 132 such as a capacitor, and variable parallel reactances 134, 136, of which the reactance 134 may be a variable capacitor and the reactance 136 may be a variable inductor. The reactances 132, 134, 136 are selected to provide an impedance at the frequency of the VHF generator 124 that allows current at that frequency to flow from the electrode 108-7 to ground.

Another feature that enables the plasma to extend to from the target to the wafer is a reduction in the gap between the wafer 110 and the target 112. The wafer-target gap is reduced to a distance less than or a fraction of the wafer diameter. For example, the gap may be $\frac{1}{5}^{th}$ of the wafer diameter. For a 300 mm wafer diameter, the wafer-target gap may be 60 mm.

Figure 2:
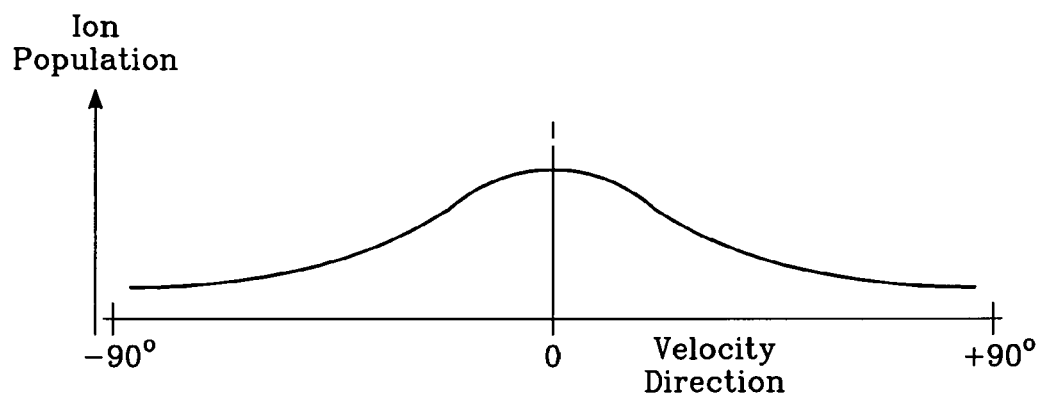
FIG. 2 is a graph of a random or near-isotropic velocity distribution of ions at the wafer surface attained in the reactor of FIG. 1.
Figure 3:
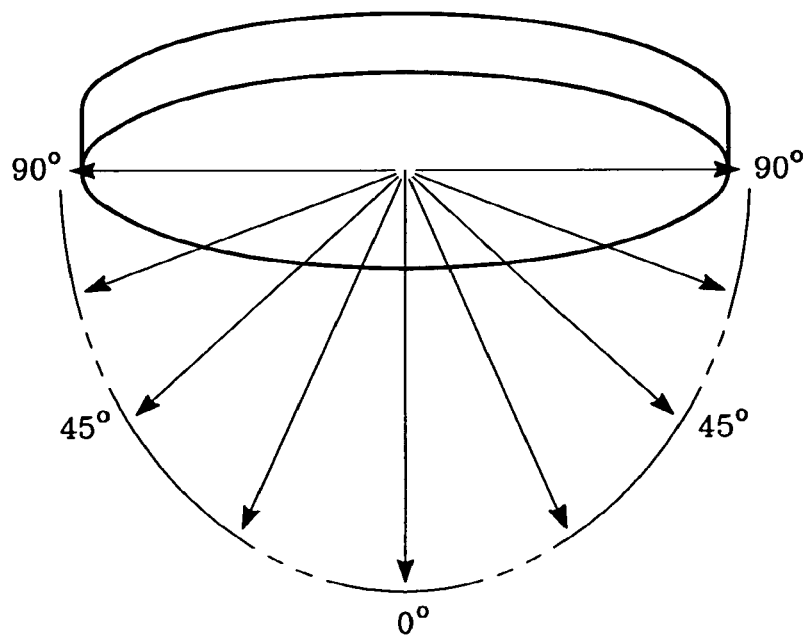
FIG. 3 is a graph depicting angular velocities in the distribution of FIG. 2.

The pump 114 is set to provide a high chamber pressure (e.g., 50-200 mT). The chamber pressure is sufficiently high to set the mean free path to less than $\frac{1}{20}$th of the length of the wafer-to-target gap. The space between the target 112 and the wafer 110 is empty, i.e., free of other apparatus, to ensure maximum dispersion of angular velocity distribution of the neutrals by the large number of collisions in their transit from the target 112 to the wafer 110. The resulting angular distribution of velocity of the neutrals in the plasma is very broad (nearly uniform) at the wafer surface within a hemispherical angular range from 0° (normal to the wafer surface) up to nearly 90° (parallel to the wafer surface). The ions have a less uniform angular distribution that peaks at the perpendicular direction, due to the attraction presented by the wafer bias voltage. FIG. 2 is a simplified diagram depicting the distribution of ion population as a function of direction in a cone of ion trajectories depicted in FIG. 3, showing a peak at the perpendicular direction. This peak has been broadened from a high variance (e.g., 0.8) to a variance (e.g., 0.2) by the large number of collisions, mainly with neutrals, that the ions experience within the wafer-target gap. These collisions compete with the electric field to reduce the sharp peak of ion velocity distribution about the vertical and provide a small component of non-vertical (e.g., horizontal) ion velocity. This broadening of the ion angular trajectory distribution is combined with the nearly isotropic angular distribution of neutral velocities. This combination improves the uniformity or conformality of the deposited film. As a result of the broadened angular distribution of ion velocity at the wafer surface, coupled with the relatively small wafer-to-target gap, metal is deposited on interior surfaces of high aspect ratio openings in the surface of the wafer with very high conformality and uniform thickness.

The capacitively coupled plasma produced at the target 112 contains ions from the carrier gas (e.g., argon ions) and ions from the target (e.g., copper ions). The copper ions require a relatively low plasma bias voltage on the wafer to deposit on the wafer surface, typically around 50 volts or less. The argon ions are more volatile than the copper ions, and at the low sheath voltage tend to elastically collide with the features on the wafer surface and disperse, rather than imparting damage. At slightly greater bias voltage levels (e.g., 300 volts), the argon ions collide inelastically with thin film features on the wafer and damage them. Therefore, ideal results can be achieved by limiting the wafer bias voltage to about 50 volts or less, for example. The problem is how to limit the wafer bias voltage to such a low level.

A first feature for limiting wafer bias voltage is one that diverts a selected portion of the plasma ions away from the wafer 110 to the chamber sidewall 102 (which is formed of a metal). This feature employs the variable VHF ground return impedance element 130 coupled to the chuck electrode 180-7 and, in addition, a second variable VHF ground return impedance element 140 coupled to the side wall 102. The sidewall variable VHF impedance element 140 has a structure similar to that of the element 130, and (in one implementation) includes a series capacitor 142, a variable parallel capacitor 144 and a variable inductor 146. The sidewall variable impedance element 140 is connected between the sidewall 102 and ground, the sidewall 102 being insulated from ground with the exception of this connection. The impedances of the two elements 130, 140 are independently adjustable, and determine the apportionment of the plasma current between the wafer 110 and the sidewall 102. Adjustment of the impedances of the elements 130, 140 is performed to reduce the wafer bias voltage down to a low level and to accurately select that level. For example, a reduction in wafer bias voltage may be obtained by increasing the resistance at the VHF source power generator frequency presented by the chuck electrode impedance element 130 (rendering the VHF ground return path through the wafer 110 less attractive) while reducing the resistance at the VHF source power generator frequency presented by the chamber sidewall impedance element 140 (rendering the VHF ground return path through the sidewall 102 more attractive). The relative impedances of the two impedance elements 130, 140 at the VHF source power frequency for a given apportionment of plasma current depends upon the relative areas of the wafer 110 and the conductive side wall 102.

Figure 6A:
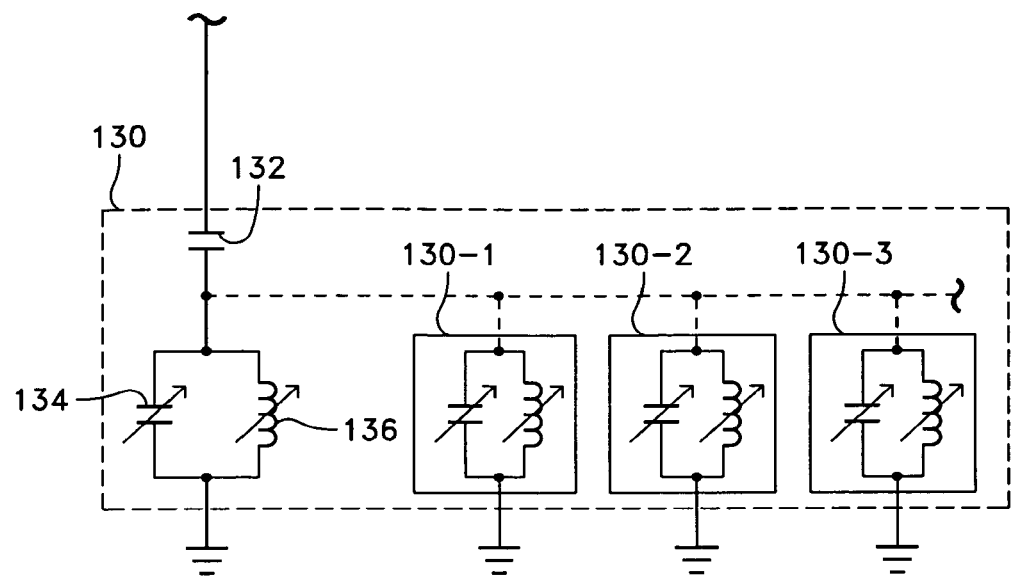
FIGS. 6A and 6B depict alternative embodiments of variable ground return impedance elements in the reactor of FIG. 1 or FIG. 5.
Figure 6B:
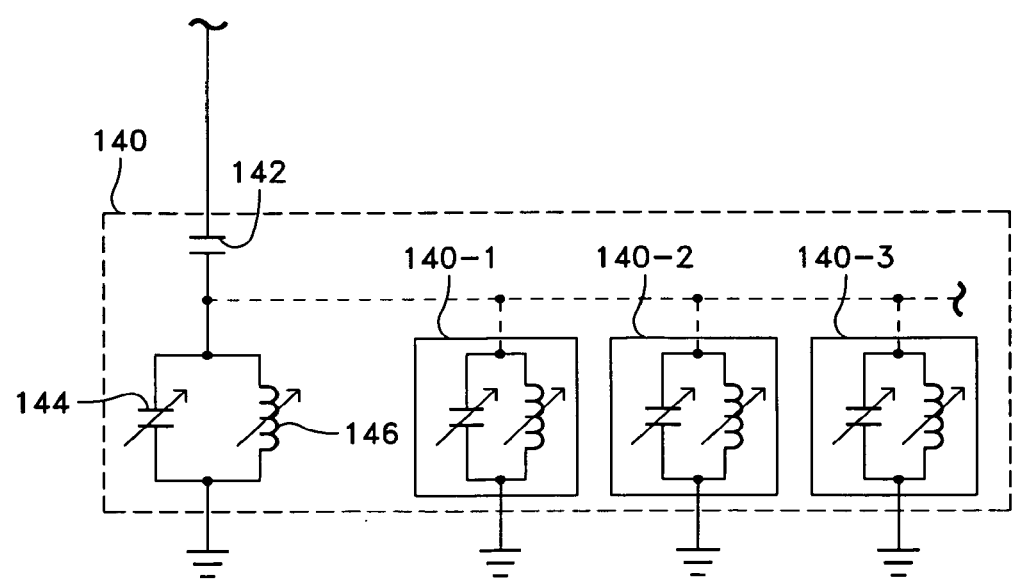

In order to reduce the conductance through a selected one of two variable impedance elements 130, 140, the impedance may be chosen to either behave as a very high resistance or open circuit at the frequency of the VHF generator 124, or to behave as a very low resistance or short circuit at harmonics of the frequency of the VHF generators (e.g., $2^{nd}$, $3^{rd}$, $4^{th}$ harmonics). Such behavior at the harmonic frequencies may be implemented in either or both of the impedance elements 130, 140 with the addition of further adjustable tank circuits for each of the harmonics of interest. This may be accomplished by adding more variable reactances to the impedance elements 130, 140 to achieve the desired filter or pass band characteristics. For example, referring to FIG. 6A, the variable impedance element 130 may further include variable resonant circuits 130-1, 130-2, 130-3 that may be tuned to provide selected impedances at the second, third and fourth harmonics, respectively. Referring to FIG. 6B, the variable impedance element 140 may further include variable resonant circuits 140-1, 140-2, 140-3 that may be tuned to provide selected impedances at the second, third and fourth harmonics, respectively.

A second feature for limiting wafer bias voltage exploits the tendency of the VHF source power applied to the target 112 to produce a modest positive bias voltage on the wafer 110 (in the absence of any other RF power being applied). This second feature involves coupling an optional low frequency RF bias power generator 150 through an impedance match 155 to the chuck electrode 108-7. As RF bias power from the generator 150 is increased from zero, the wafer bias voltage, which is initially positive under the influence of the VHF source power from the VHF generator 124, is shifted down and at some point crosses zero and becomes negative. By carefully adjusting the output power level of the bias power generator 150 to a small power level (e.g., about 0.1 kW), the wafer bias voltage can be set to a very small value (e.g., to less than 50 volts).

Since the VHF source power generator 124 provides plasma source power for the generation of plasma ions near the target 112, the D.C. power source 122 is not the sole source of power for plasma generation. The demands on the D.C. power source 122 are further lessened because the reduced wafer-target gap reduces loss of plasma density between the target 112 and the wafer 110. Therefore, the D.C. power level of the D.C. supply 122 may be reduced from the conventional level (e.g., 35-40 kW) to as low as 2 kW. This feature reduces the sputtering rate of the target 112 and therefore reduces the consumption of the target, cost of operation and thermal load on the entire system. Moreover, it reduces the deposition rate on the wafer 110. At the higher D.C. power level (e.g., 38 kW) the deposition rate was extremely high, and the deposition time had to be limited to about 5 seconds for a typical copper film deposition thickness, of which the first 2 seconds were spent by the impedance match 126 reaching equilibrium or stability following plasma ignition. At the new (reduced) D.C. power level (of a few kW or less), the deposition time may be on the order of 30 seconds, so that the impedance match 126 is stable for a very high percentage of the process time.

The increase in uniformity of the metal coating on interior surfaces of high aspect ratio openings increases the process window over which the reactor may be operated. In the prior art, the metal deposition on the interior surfaces of high aspect ratio openings was highly non-uniform, which allowed for only a very small wafer-to-wafer variation in performance and a very narrow process window within which adequate metal coating could be realized for all internal surfaces of a high aspect ratio opening. Furthermore, the inadequate deposition thickness on sidewalls of high aspect ratio openings required the performance of a second step following deposition, namely a re-sputtering step in which excess material deposited on the floor or bottom of an opening is transferred to the sidewall. The re-sputtering step has typically required an excess thickness to be deposited on the floor of the high aspect ratio opening. With the present embodiment, the improved uniformity of the deposition on the floor and sidewall of the opening eliminates the need for re-sputtering and the need for excess thickness on the bottom of the opening. This increases productivity and reduces the amount of material that must be removed when opening a via through the floor of the high aspect ratio opening.

The total power applied to the chamber is reduced in the embodiment of FIG. 1 from a convention PEPVD process, as can be seen in the following table (Table I).

TABLE I

|  | conventional reactor | reactor of FIG. 1 |
| --- | --- | --- |
| D.C. power | 38 kW | 2 kW |
| RF source power | 1 kW | 4 kW |
| RF bias power | 1 kW | 0.1 kW |
| TOTAL POWER | 40 kW | 6.1 kW |
| gap | 390 mm | 60 mm |
| pressure | 0.5 mT | 100 mT |
| mean free path | 550 mm | 2.7 mm |
| collisions/transit | 0.30 | 22.22 |

The disclosed process overcomes the problem of shadowing during PECVD processes for metal deposition in high aspect ratio openings. Such openings may be on the order of 22 nanometers in diameter and have a 7:1 aspect ratio (height:width). Prior to the invention, PECVD metal deposition in such openings near the edge of a 300 mm wafer exhibited great non-uniformity due to shadowing effects. The ratio between the metal deposited on radially inner and outer sides of the opening sidewall was as great as 50:1, corresponding to a highly non-uniform sidewall deposition. With the process disclosed above, it is improved to nearly 1:1, a uniform sidewall deposition.

Figure 4:
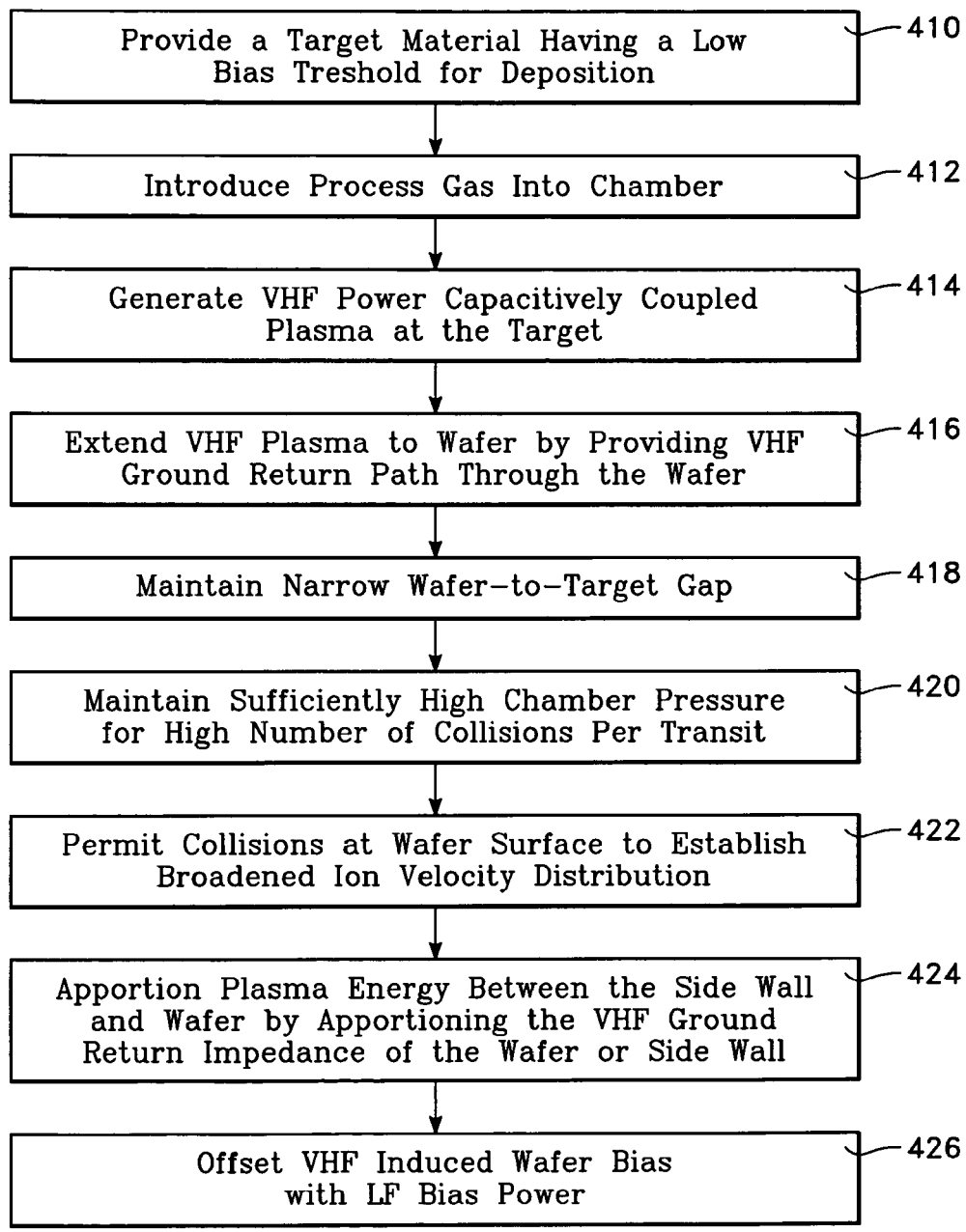
FIG. 4 is block diagram depicting method in accordance with one embodiment.

FIG. 4 depicts a method in accordance with one aspect. A target is provided having a material (such as copper) requiring a low wafer bias voltage (e.g., 10-50 volts) for deposition (block 410 of FIG. 4). A carrier gas such as argon is introduced into the chamber that tends not to produce ion bombardment damage at a low wafer bias voltage (block 412). A plasma is generated at the target by capacitively coupling VHF source power using the target as an electrode (block 414). This plasma is extended down to the wafer by providing a VHF ground return path through the wafer (block 416), and by establishing a narrow wafer-to-target gap (block 418). The chamber pressure is maintained at a sufficiently high level (e.g., 100 mT) to ensure an ion mean free path length that is less than $1/20^{th}$ of the wafer-target gap (block 420), to establish a random or nearly isotropic ion velocity distribution at the wafer surface (block 422). The wafer bias voltage is minimized by apportioning the plasma between a ground return path through the wafer at a first impedance and a ground return path through the chamber sidewall at a second impedance (block 424). The wafer bias voltage is further minimized by offsetting a positive bias voltage induced by the VHF source power with a negative bias voltage induced by an LF bias power generator (block 426). The steps of blocks 424 and 426 are performed so as to keep the wafer bias below a threshold at which the carrier gas ions can inflict ion bombardment damage but above the necessary threshold to deposit the target material.

Figure 5:
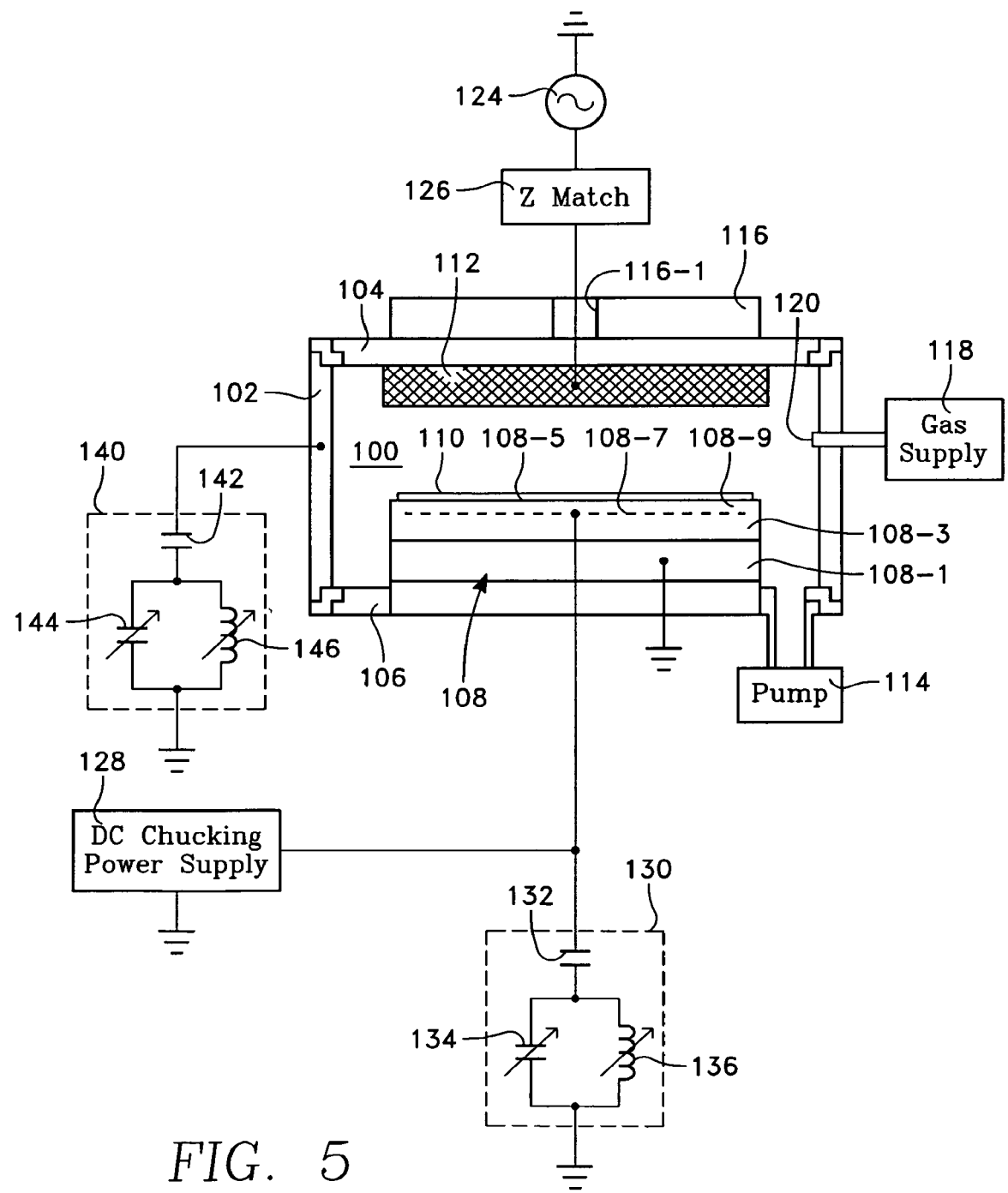
FIG. 5 is a diagram of a plasma reactor in accordance with a second aspect.

FIG. 5 depicts a modification of the embodiment of FIG. 1, in which the sputter target D.C. power supply 122 is eliminated and in which the optional RF bias power generator 150 and match 155 are not present. In the embodiment of FIG. 5, the wafer-target gap is sufficiently small and the VHF source power generator 124 has a sufficiently high output power level to provide, with the attraction of a VHF return path through the wafer 110, the plasma ion density at the target 112 necessary for a desired sputtering rate at the target and deposition rate at the wafer. In the absence of the D.C. power on the target, the target consumption is slower and the thermal load on the system is less and the process window is wider.

While the foregoing is directed to embodiments of the present invention, other and further embodiments of the invention may be devised without departing from the basic scope thereof, and the scope thereof is determined by the claims that follow.

What is claimed is:

1. A method of performing physical vapor deposition on a workpiece in a reactor chamber, comprising:
supporting a workpiece in a chamber that includes a target comprising a metallic element and having a surface facing the workpiece with a target-to-workpiece gap less than a diameter of said workpiece;
introducing a carrier gas into the chamber;
applying RF plasma source power from a VHF generator to said target to generate a capacitively coupled plasma at said target;
extending said plasma across said gap to said workpiece by providing through said workpiece a first VHF ground return path at the frequency of said VHF generator; and maintaining gas pressure in the chamber above a threshold pressure at which an ion collision mean free path of the plasma is less than 5% of said gap.

2. The method of claim 1 wherein said target-to-workpiece gap does not exceed ⅕ of said diameter of said workpiece.

3. The method of claim 2 where the diameter of said workpiece is about 300 mm, said gap is about 60 mm and said gas pressure is about 100 mT.

4. The method of claim 1 further comprising limiting a bias voltage on said workpiece relative to plasma in said chamber below an upper threshold voltage corresponding to an ion bombardment threshold voltage of said carrier gas.

5. The method of claim 4 further comprising holding said bias voltage above a lower threshold voltage corresponding to a deposition threshold voltage of said metallic element.

6. The method of claim 4 wherein said limiting a bias voltage on said workpiece comprises providing through a sidewall of the chamber a second VHF ground return path, and apportioning the resistances at said VHF frequency of said first and second ground return paths.

7. The method of claim 4 wherein said limiting a bias voltage on said workpiece comprises coupling a low frequency RF plasma bias power generator to said workpiece, and adjusting a level of RF bias power from said RF bias power generator to reduce a net bias voltage on said workpiece.

8. The method of claim 7 wherein said adjusting a level of RF bias power comprises increasing said level of RF bias power so as to decrease said bias voltage on said workpiece.

9. The method of claim 8 wherein said bias voltage on said workpiece comprises a positive voltage component attributable to said VHF source power applied to said target and a negative voltage component that is a function of said level of RF bias power, said adjusting comprising offsetting said positive voltage component with said negative voltage component.

10. The method of claim 1 further comprising:
applying D.C. power to said target.

11. The method of claim 1 further comprising:
generating a rotating magnetron field at said target.

12. A method of performing physical vapor deposition on a workpiece in a reactor chamber, comprising:

providing a target comprising a metallic element and having a surface facing the workpiece, and establishing a target-to-workpiece gap less than a fraction of a diameter of said workpiece, the space of said gap devoid of structural elements;
introducing a carrier gas into the chamber;
applying RF plasma source power from a VHF generator to said target to generate a capacitively coupled plasma at said target;
extending said plasma across said gap to said workpiece by providing through said workpiece a first VHF ground return path at the frequency of said VHF generator; and
maintaining a gas pressure in said chamber such that sufficient to establish a substantially isotropic distribution of neutral velocity and a distribution of ion velocity having a larger vertical component than horizontal component.

13. The method of claim 12 further comprising limiting a bias voltage on said workpiece relative to plasma in said chamber below an upper threshold voltage corresponding to an ion bombardment threshold voltage of said carrier gas.

14. The method of claim 13 wherein said limiting a bias voltage on said workpiece comprises providing through a sidewall of the chamber a second VHF ground return path, and apportioning the resistances at said VHF frequency of said first and second ground return paths.

15. The method of claim 13 wherein said limiting a bias voltage on said workpiece comprises coupling a low frequency RF plasma bias power generator to said workpiece, and offsetting a positive bias voltage of said workpiece by increasing a level of RF bias power from said RF bias power generator to reduce a net bias voltage on said workpiece.

16. The method of claim 1, wherein the gas pressure is maintained in the chamber at pressure sufficient to establish a substantially isotropic distribution of neutral velocity and a distribution of ion velocity having a larger vertical component than horizontal component.

17. The method of claim 1, wherein the target comprises copper, titanium, tungsten, or tin.

18. The method of claim 1, wherein the carrier gas is an inert gas or a nitrogen gas.

* * * * *